US010867961B2

(12) United States Patent
Hu et al.

(10) Patent No.: US 10,867,961 B2
(45) Date of Patent: *Dec. 15, 2020

(54) SINGLE LAYER LOW COST WAFER LEVEL PACKAGING FOR SFF SIP

(71) Applicant: Intel Corporation, Santa Clara, CA (US)

(72) Inventors: Chuan Hu, Chandler, AZ (US); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 16/015,052

(22) Filed: Jun. 21, 2018

(65) Prior Publication Data

US 2018/0301435 A1    Oct. 18, 2018

Related U.S. Application Data

(60) Continuation of application No. 15/042,075, filed on Feb. 11, 2016, now Pat. No. 10,014,277, which is a (Continued)

(51) Int. Cl.
*H01L 23/00* (2006.01)
*H01L 25/03* (2006.01)
(Continued)

(52) U.S. Cl.
CPC ............ *H01L 24/97* (2013.01); *H01L 21/563* (2013.01); *H01L 21/565* (2013.01); (Continued)

(58) Field of Classification Search
CPC ..... H01L 2924/15311; H01L 2924/181; H01L 21/563; H01L 21/565; H01L 24/81; (Continued)

(56) References Cited

U.S. PATENT DOCUMENTS 5,353,498 A * 10/1994 Fillion ................ H01L 25/0657
29/840
6,271,469 B1    8/2001 Ma et al.
(Continued)

FOREIGN PATENT DOCUMENTS

WO    WO-2013184145    12/2013

OTHER PUBLICATIONS

Chien et al., "Chip Embedded Wafer Level Packaging Technology for Stacked RF-SiP Application", 2007 Electronic Components and Technology Conference, IEEE, 2007, pp. 305-310.
(Continued)

*Primary Examiner* — Duy T Nguyen
(74) *Attorney, Agent, or Firm* — Schwabe, Williamson & Wyatt, P.C.

(57) ABSTRACT

In one embodiment of the invention, a system in package (SiP) is described which includes a plurality of device components with different form factors embedded within a molding compound layer. A surface for each of the device components is coplanar with a surface of the molding compound layer, and a single redistribution layer (RDL) formed on the coplanar surfaces of the molding compound layer and the plurality of device components. An active device die is electrically bonded to the single RDL directly vertically adjacent the plurality of device components. In an embodiment, the SiP is electrically connected to a circuit board with the active device die between the single RDL and the circuit board. In an embodiment, the SiP is electrically connected to a circuit board with the active device die over the single RDL and the circuit board.

20 Claims, 8 Drawing Sheets

Related U.S. Application Data division of application No. 13/532,119, filed on Jun. 25, 2012, now Pat. No. 9,281,292.

(51) Int. Cl.

| | | |
|---|---|---|
| *H01L 21/56* | (2006.01) | |
| *H01L 25/16* | (2006.01) | |
| *H01L 21/768* | (2006.01) | |
| *H01L 21/78* | (2006.01) | |

(52) U.S. Cl.
CPC .......... *H01L 21/568* (2013.01); *H01L 21/768* (2013.01); *H01L 21/78* (2013.01); *H01L 24/11* (2013.01); *H01L 24/19* (2013.01); *H01L 24/81* (2013.01); *H01L 24/96* (2013.01); *H01L 25/03* (2013.01); *H01L 25/16* (2013.01); *H01L 24/73* (2013.01); *H01L 2224/04105* (2013.01); *H01L 2224/12105* (2013.01); *H01L 2224/16225* (2013.01); *H01L 2224/24137* (2013.01); *H01L 2224/24195* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81* (2013.01); *H01L 2224/81191* (2013.01); *H01L 2224/83385* (2013.01); *H01L 2224/85* (2013.01); *H01L 2224/97* (2013.01); *H01L 2924/12042* (2013.01); *H01L 2924/15192* (2013.01); *H01L 2924/15311* (2013.01); *H01L 2924/15321* (2013.01); *H01L 2924/181* (2013.01); *H01L 2924/19011* (2013.01); *H01L 2924/3011* (2013.01); *Y10T 29/4913* (2015.01); *Y10T 29/49124* (2015.01)

(58) Field of Classification Search
CPC ....... H01L 2924/15321; H01L 2924/00; H01L 2224/32225; H01L 2224/48227; H01L 2224/73265; H01L 2224/97; H01L 2924/00012; H01L 2224/16225; H01L 2224/73204; H01L 2224/48091; H01L 2224/81; H01L 2224/85; H01L 2924/12042; H01L 2924/3011; H01L 2924/00014; H01L 21/568; H01L 21/768; H01L 21/78; H01L 2224/04105; H01L 2224/12105; H01L 2224/24137; H01L 2224/24195; H01L 2224/81191; H01L 2224/83385; H01L 24/11; H01L 24/19; H01L 24/73; H01L 24/96; H01L 24/97; H01L 25/03; H01L 25/16; H01L 2924/15192; H01L 2924/19011

USPC ....................................................... 257/723

See application file for complete search history.

(56) References Cited

U.S. PATENT DOCUMENTS

| | | | |
|---|---|---|---|
| 6,507,115 | B1 | 1/2003 | Hofstee et al. |
| 6,693,362 | B2 | 2/2004 | Seyama et al. |
| 8,208,268 | B2 | 6/2012 | Kajiki et al. |
| 2003/0045083 | A1* | 3/2003 | Towle ............... H01L 23/49838 438/612 |
| 2006/0019611 | A1 | 1/2006 | Mages |
| 2007/0246813 | A1* | 10/2007 | Ong .................... H01L 23/3128 257/686 |
| 2007/0262436 | A1* | 11/2007 | Kweon ................ H01L 21/561 257/686 |
| 2008/0173961 | A1 | 7/2008 | Naito et al. |
| 2008/0316714 | A1* | 12/2008 | Eichelberger ....... H01L 23/5389 361/728 |
| 2010/0001396 | A1* | 1/2010 | Meyer .................. H01L 21/568 257/723 |
| 2011/0165734 | A1 | 7/2011 | Han et al. |
| 2011/0278707 | A1 | 11/2011 | Chi et al. |
| 2011/0285007 | A1* | 11/2011 | Chi ........................ H01L 24/19 257/686 |
| 2012/0018895 | A1 | 1/2012 | Oganesian et al. |
| 2012/0056312 | A1* | 3/2012 | Pagaila ................ H01L 21/561 257/684 |
| 2012/0267751 | A1 | 10/2012 | Haba et al. |
| 2012/0273960 | A1 | 11/2012 | Park et al. |

OTHER PUBLICATIONS

Towle et al., "Bumpless Build-up Layer Packaging" Proceedings ASME Int. Mech. Eng. Congress and Exposition (IMECE), New York, Nov. 11-16, 2001, 7 pages.

\* cited by examiner

SINGLE LAYER LOW COST WAFER LEVEL PACKAGING FOR SFF SIP

CLAIM OF PRIORITY

This is a continuation of U.S. patent application Ser. No. 15/042,075 filed Feb. 11, 2016, now U.S. Pat. No. 10,014,277 issued on Jul. 3, 2018, which is a divisional of U.S. patent application Ser. No. 13/532,119 filed Jun. 25, 2012, now U.S. Pat. No. 9,281,292 issued on Mar. 8, 2016, which are hereby incorporated by reference.

BACKGROUND

Continued reduction in end product size of mobile electronic devices such as smart phones and ultrabooks is a driving force for the development of packaging with a small form factor (SFF). System in package (SiP) technologies have been developed to incorporate multiple components into a single package to reduce the system board space and board mounted height.

DETAILED DESCRIPTION

Embodiments of the present invention relate to a SiP structure and method of forming a SiP structure with SFF. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In one aspect, embodiments of the invention enable the fabrication of SiP with a reduced form factor in the x, y, and z directions by placing an active device die directly vertically adjacent, or in the shadow of, an arrangement of passive device components that have different form factors (x, y, and z). In a particular embodiment directed toward a mobile radio frequency (RF) device, RF passive device components and/or active device components having different form factors (x, y, and z) are first assembled on a substrate surface through a wafer level packaging process and molded using molding compound. The substrate is removed and a single redistribution layer (RDL) is formed on coplanar surfaces of the molding compound layer and the plurality of device components. A system on chip (SOC) die such as a radio transceiver integrated circuit (IC) is then assembled bonded to the single RDL directly vertically adjacent the plurality of device components. In this manner, the passive and/or active device components and the silicon radio transceiver IC are integrated in a SiP at wafer level with a single RDL. This approach can provide for reduced form factor in the x, y, and z directions, and lower cost since a single RDL is used. Furthermore, the fabrication approach may improve system performance due to shorter interconnects between the radio transceiver IC and the RF device components.

Figure 1:
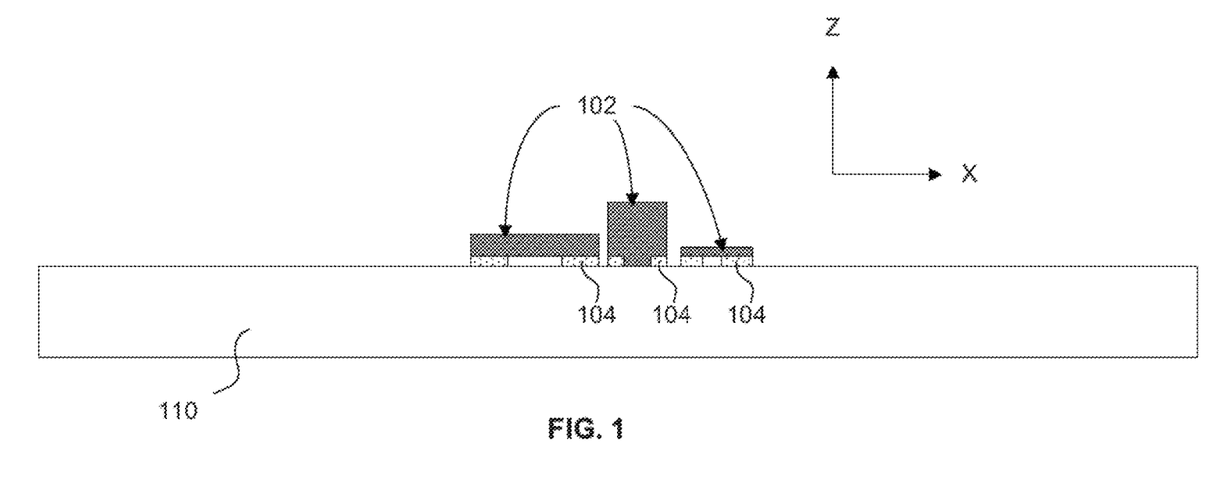
FIG. 1 is a cross-sectional side view illustration of a plurality of device components placed on a carrier substrate in accordance with an embodiment of the invention.

Referring now to FIG. 1, a plurality of device components 102 including electrical contacts 104 are placed on a carrier substrate 110. Carrier substrate can be any planar substrate, such as tape, silicon wafer, glass, metal, or polymer. The plurality of device components 102 may have different form factors in any or all of the (x, y, z) dimensions. In the particular cross-sectional side view illustration of FIG. 1, the plurality of device components 102 are illustrated with different x and z dimensions. As illustrated, the device components 102 include electrical contacts 104 embedded within or protruding from a bulk area of the device components 102.

The plurality of device components 102 can be passive device components and/or active device components. In one embodiment, all of the device components 102 are passive device components. In an embodiment, the device components 102 include both passive and active device components. For example, passive device components can include any of a band pass filter, capacitor, inductor, resistor, and crystal for clock generation. For example, active device components can include any of a power amplifier and an RF switch.

Figure 2:
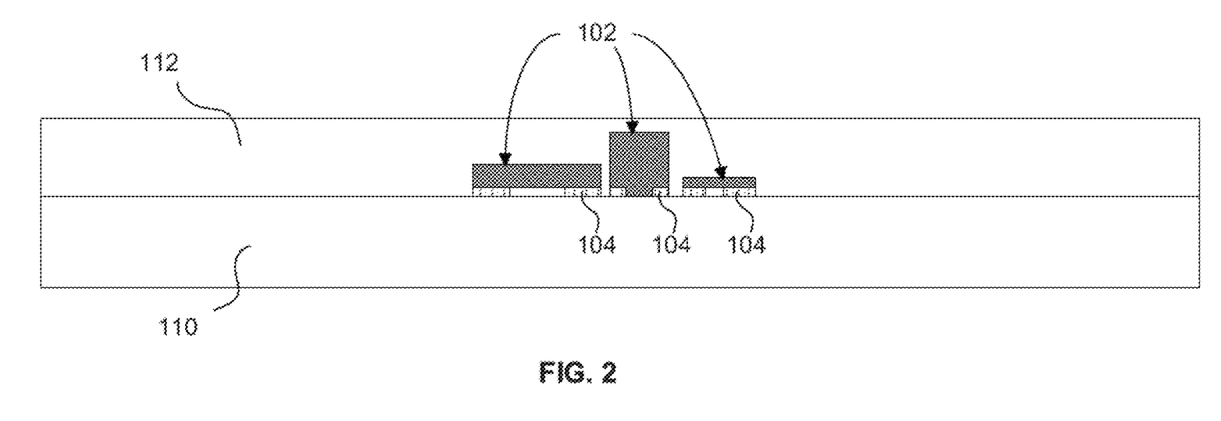
FIG. 2 is a cross-sectional side view illustration of a molding compound layer formed over the plurality of device components of FIG. 1 in accordance with an embodiment of the invention.

Referring now to FIG. 2, a molding compound layer 112 is formed over the plurality of device components 102 and the carrier substrate 110. Molding compound may be any molding compound utilized in packaging technologies, and may be applied in a variety of manner including spin coating, injection molding, compression molding, and transfer molding. For example, the molding compound can be a thermosetting material such as, but not limited to, epoxy resin, phenolic resin, polyimide, and poly-benzoxasole (PBO). The molding compound may also be filled. In an embodiment, the molding compound comprises approximately 90% filler, such as silica particles. The molding compound layer 112 is then fully cured to solidify the alignment of the device components 102 and provide rigidity for handling.

Figure 3:
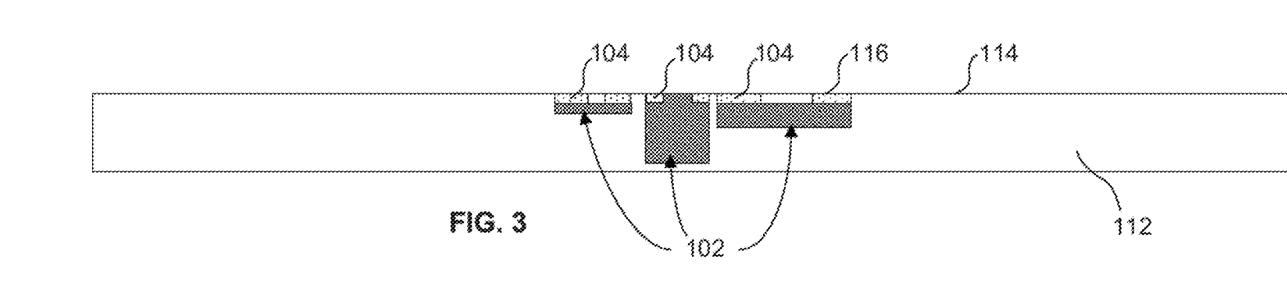
FIG. 3 is a cross-sectional side view illustration of the carrier substrate of FIG. 2 removed in accordance with an embodiment of the invention.

The carrier substrate 110 is then released as illustrated in FIG. 3 utilizing a suitable technique such as peeling, laser lift off, and ultraviolet (UV) irradiation. As illustrated, the exposed surface 116 for each of the device components 102 which was previously in contact with the carrier substrate 110 is coplanar with the exposed surface 114 of the molding compound layer 112 which was previously in contact with the carrier substrate 110.

Figure 4:
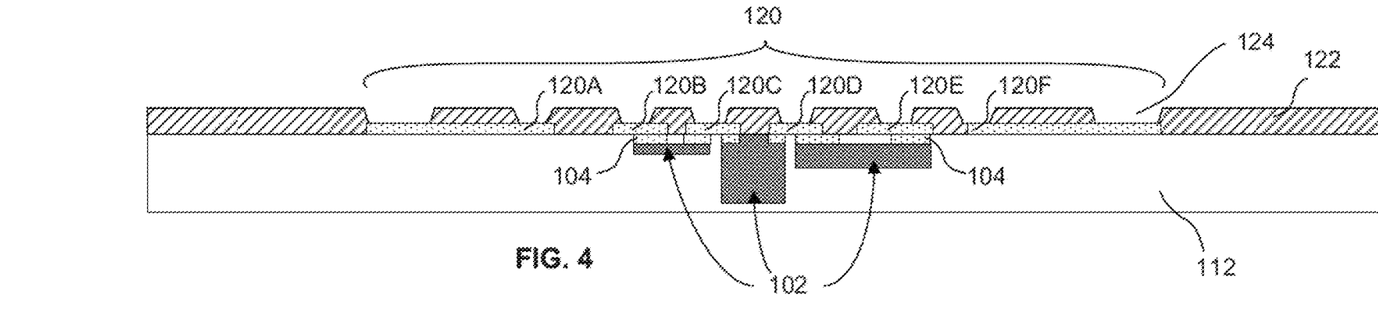
FIG. 4 is a cross-sectional side view illustration of a single redistribution layer and buildup layer formed over the structure of FIG. 3 in accordance with an embodiment of the invention.

Referring now to FIG. 4, a single redistribution layer (RDL) 120 fan-out and buildup layer 122 are formed on the coplanar surfaces 114, 116. The patterned RDL 120 with multiple traces 120A-F is first formed, followed by depositing buildup layer 122 over the RDL 120 and patterning the buildup layer to form a plurality of openings 124, which may expose contact pads of traces 120A-F. In an embodiment, the single RDL is 7-10 μm thick, and the buildup layer 122 is approximately 20-30 μm thick. In this manner, the single and thin RDL and buildup layer can reduce the (z) form factor dimension. A variety of dielectric materials may be used to form buildup layer 122. In an embodiment, a photosensitive polyimide is used. In such an embodiment, the photosensitive polyimide is cured by UV irradiation after patterning to form openings 124.

Figure 5:
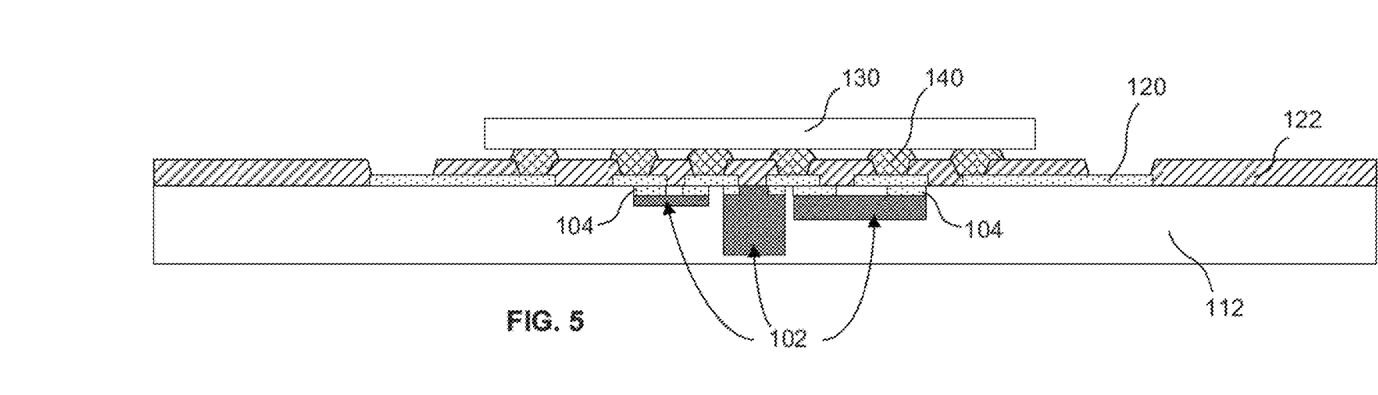
FIG. 5 is a cross-sectional side view illustration of an active device die electrically bonded to the single redistribution layer of FIG. 4 in accordance with an embodiment of the invention.

An active device die 130 is then electrically bonded to the single RDL 120 directly vertically adjacent the plurality of device components 102, as illustrated in FIG. 5. In the particular embodiment illustrated, the active device die 130 is electrically bonded to the single RDL 120 with solder balls 140. For example, such a connection can be made by pick and place of the active device die 130 followed by solder reflow, or thermal compression bonding (TCB). As illustrated, the bump pattern for solder balls 140 of the active device die 130 are aligned with the device components 102 for minimum lateral routing and fan-out, which can reduce the (x, y) form factor dimensions. In another embodiment illustrated in FIG. 12 and described in more detail in the following description, the active device die 130 is electrically bonded to the single RDL 120 with wire bonds 154.

Figure 6A:
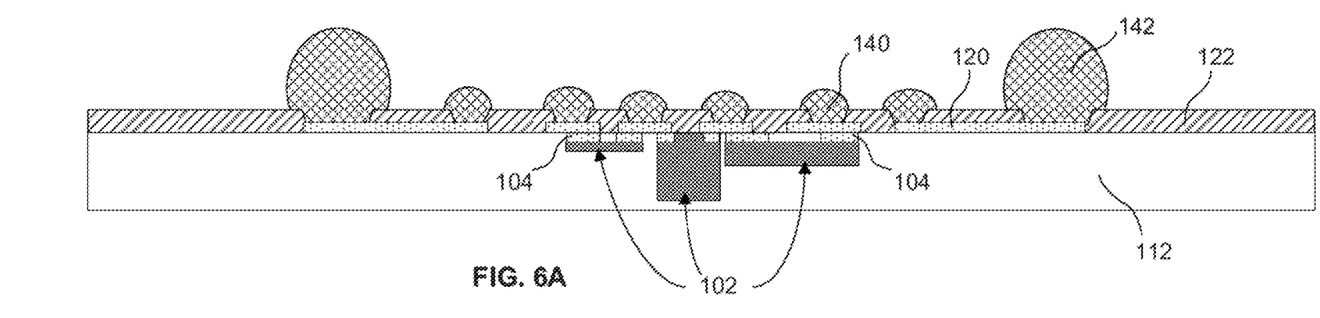
FIGS. 6A-6C are cross-sectional side view illustrations of various sequences for the formation of conductive bumps in accordance with embodiments of the invention.
Figure 6B:
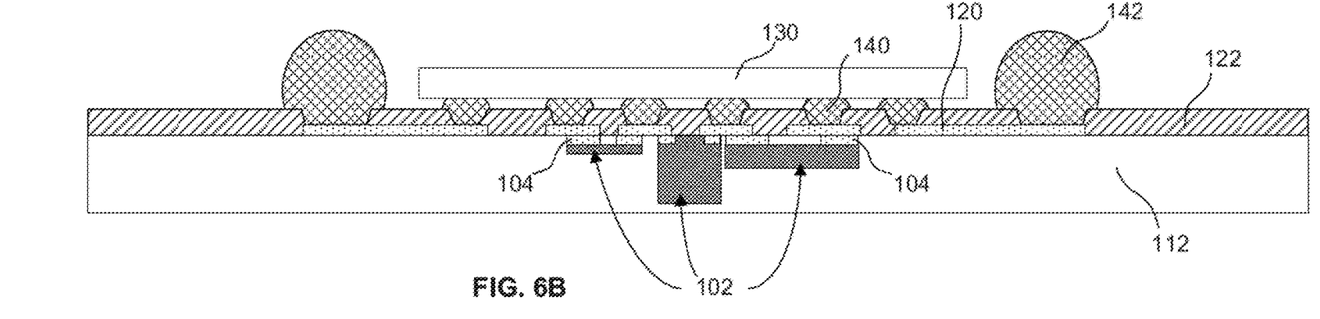
Figure 6C:
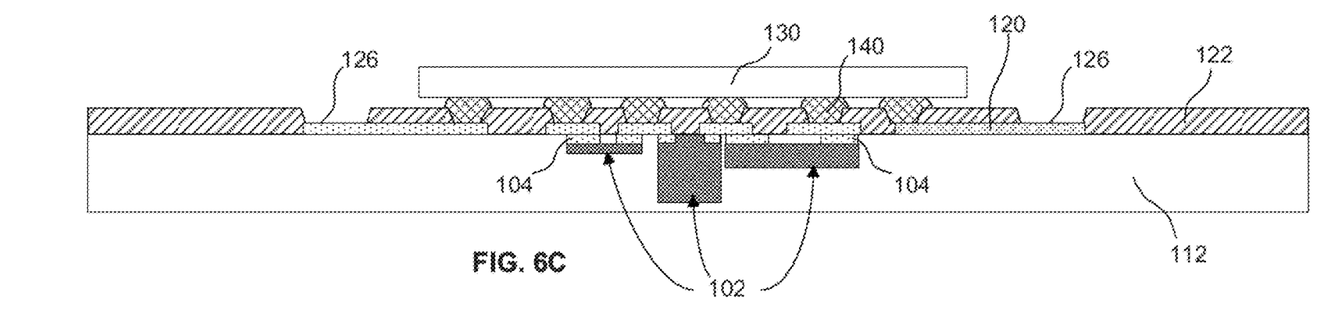
Figure 10:
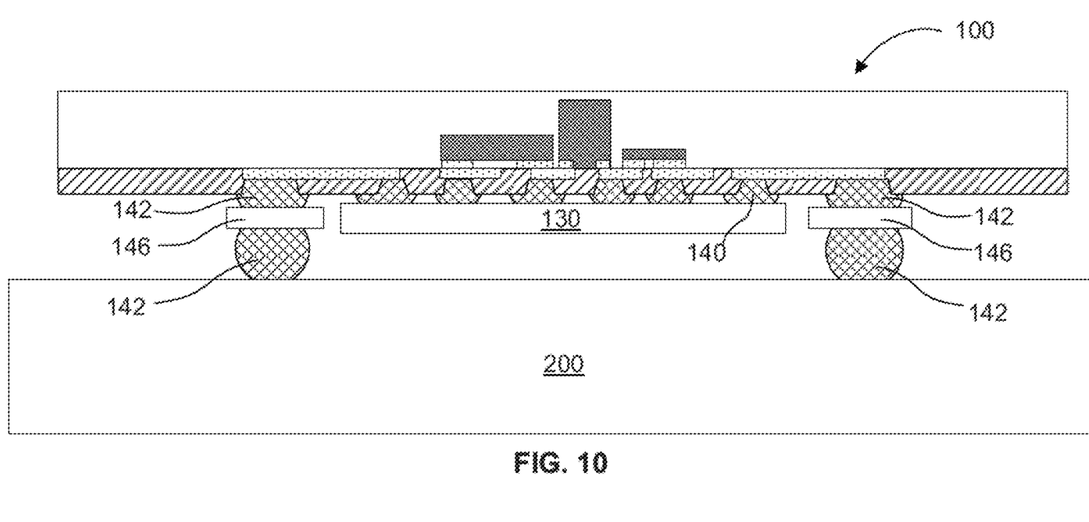
FIG. 10 is a cross-sectional side view illustration of a package electrically connected to a circuit board with interposers between bumps in accordance with an embodiment of the invention.

Referring now to FIGS. 6A-6C, electrical interconnects 142, such as conductive bumps, may be formed for electrically bonding the single RDL to a circuit board, in accordance with some embodiments. In the embodiments illustrated in FIGS. 6A-6C, the conductive bumps 142 are arranged along a periphery of the single RDL 120. Referring to FIG. 6A, conductive bumps 142 having a height larger than the height higher than solder balls 140 is placed on the single RDL prior to electrically bonding the active device die 130 to the single RDL 120. Referring to FIG. 6B, conductive bumps 142 having a height larger than reflowed solder balls 140 and the active device die 130 together are placed on the single RDL 120 after electrically bonding the active device die 130 to the single RDL 120. Referring to FIG. 10, where an interposer is used, conductive bumps 142 are not required to be higher than the reflowed solder balls 140 and the active device die 130.

Conductive bumps 142 can be formed using a variety of processes including screen printing or microball ball grid array (BGA). Referring now to FIG. 6C, conductive bumps 142 can be placed on the board side rather than (or in addition to) on the single RDL, in which case bonding pads 126 in the single RDL 120 are open. For example, where an interposer is used, conductive bumps 142 can be placed on both the board side and the single RDL.

Figure 7:
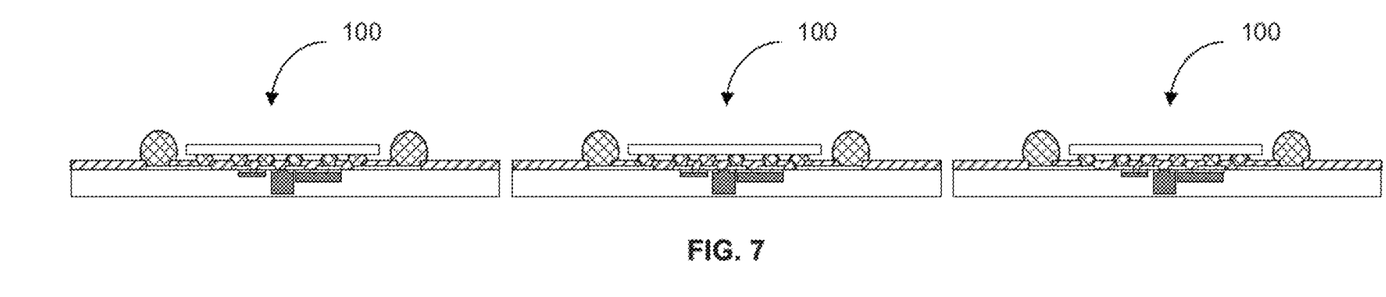
FIG. 7 is a cross-sectional side view illustration of singulated packages in accordance with an embodiment of the invention.

Referring now to FIG. 7 the molding compound layer with a plurality of embedded device components and buildup layer are singulated to form a plurality of system in packages (SiPs) 100. Thus, while the formation of a single SiP has been described hereto, multiple SiPs can be manufactured beginning with the same molding compound layer, etc. In an embodiment, each SiP 100 includes a plurality of device components 102 with different form factors embedding within the singulated molding compound layer 112, where a surface for each of the device components is coplanar with a surface of the molding compound layer 122. A single RDL is formed on the coplanar surfaces of the molding compound layer 112 and the plurality of device components 102. An active device die 130 electrically bonded to the single RDL 120 directly vertically adjacent the plurality of device components 102. Each individual SiP 100 may then be connected to a circuit board. For example, the circuit board can be a daughter card which is to be placed on a motherboard of a mobile computing device such as a smart phone or ultrabook. Alternatively, the circuit board may be the motherboard.

Figure 8:
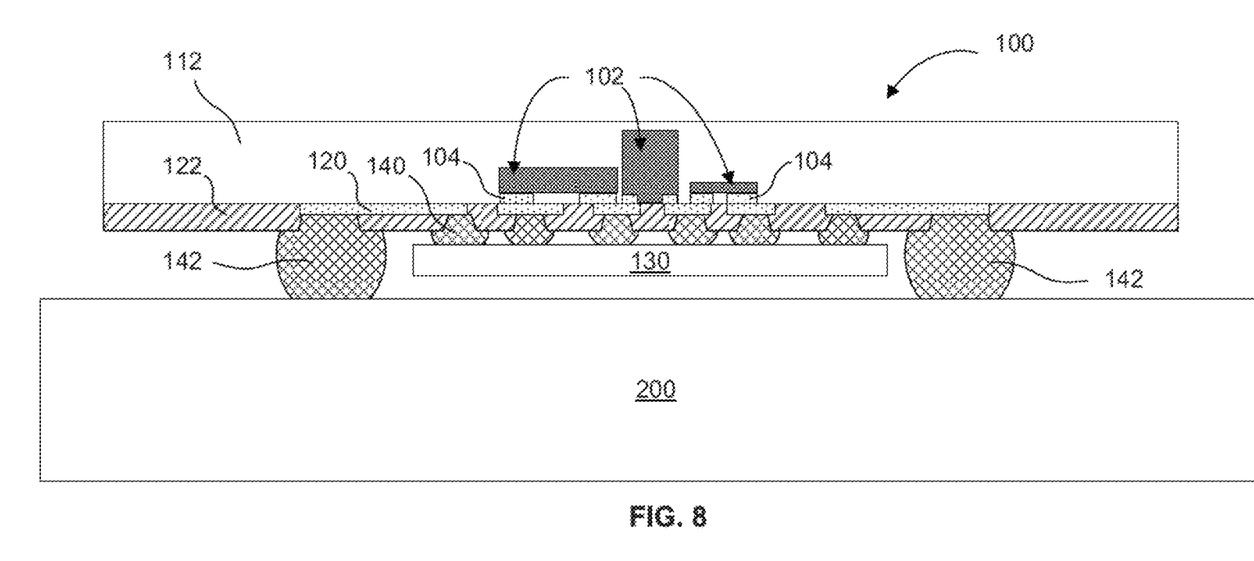
FIG. 8 is a cross-sectional side view illustration of a package electrically connected to a circuit board in accordance with an embodiment of the invention.

In an embodiment illustrated in FIG. 8, the SiP 100 is electrically connected to circuit board 200 with conductive bumps 142. In an embodiment, bumps 142 are solder bumps. As described above, conductive bumps 142 may have a height larger than reflowed solder balls 140 and the active device die 130 together.

In the following description of FIGS. 9-14, several variations of the SiP 100 and manner for electrically connecting the SiP 100 to a circuit board 200 are described. It is to be understood that while the following variations are separately illustrated and described, the variations are not necessarily incompatible with one another, and that many of the variations may be combined in any suitable manner in one or more embodiment.

Figure 9:
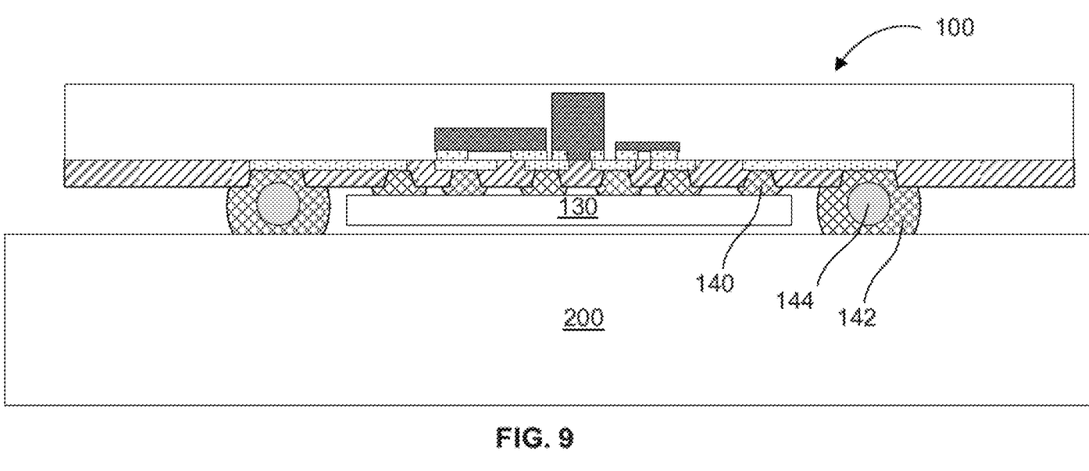
FIG. 9 is a cross-sectional side view illustration of a package electrically connected to a circuit board with cored solder balls in accordance with an embodiment of the invention.

Referring now to an embodiment illustrated in FIG. 9, bumps 142 may include an inner core 144 within an outer shell. Inner core 144 may be formed of a material (e.g copper) which has a higher melting temperature than the outer shell (e.g. solder material) of bumps 142 so as to provide structural height to the system, which may maintain a gap between circuit board 200 and active device die 130. Structural height may also be maintained through bonding of the SiP 100 to circuit board 200 by use of interposers 146 between bumps 142, as illustrated in FIG. 10. In the embodiment illustrated in FIG. 10, conductive bumps 142 are not required to be higher than the reflowed solder balls 140 and the active device die 130. For example, the conductive bumps 142 can be approximately the same height as the solder balls 140 prior to reflow. Bumps 142 may have different sizes/heights on the SiP 100 side and circuit board 200 side of interposers 146.

Figure 11:
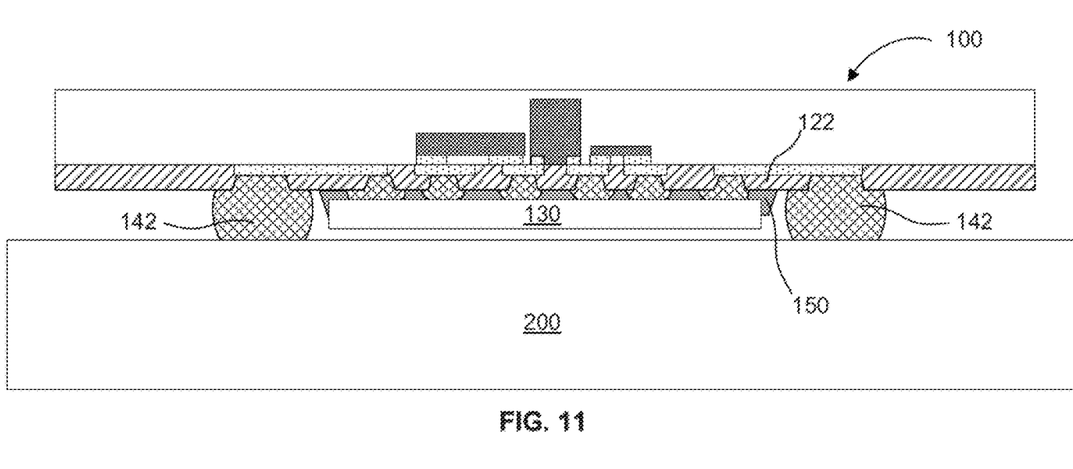
FIG. 11 is a cross-sectional side view illustration of an underfill material between a buildup layer and an active device die in accordance with an embodiment of the invention.

Referring to FIG. 11, in an embodiment, and underfill material 150 may be formed between the buildup layer 122 and active device die 130. In an embodiment, the underfill material is applied prior to singulating the SiP.

Figure 12:
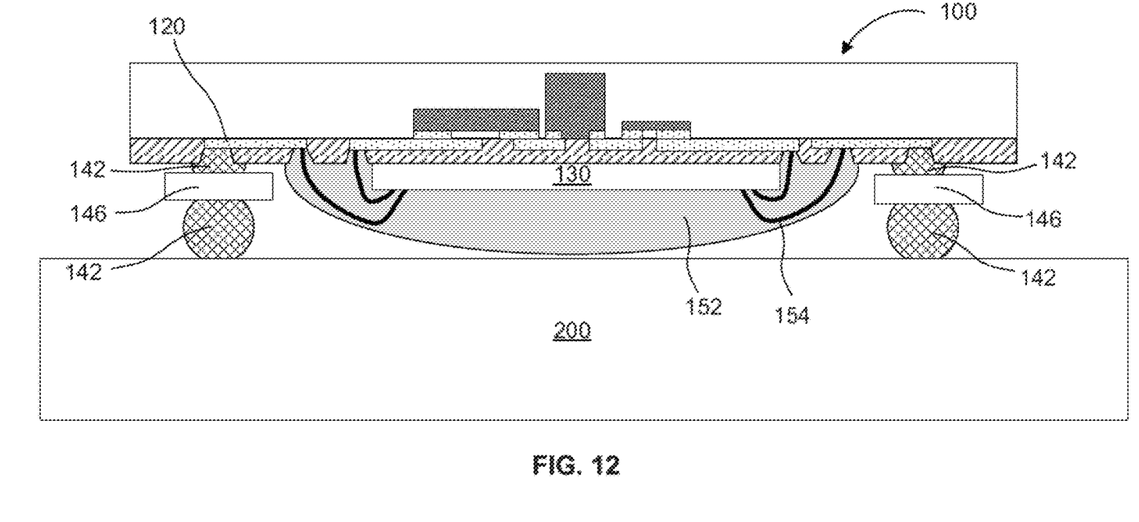
FIG. 12 is a cross-sectional side view illustration of an active device die electrically connected to a single redistribution layer with wire bonds in accordance with an embodiment of the invention.

Referring now to FIG. 12, in an embodiment, the active device die 130 is electrically connected to the single RDL 120 with wire bonds 154. The wire bonds 154 may further be protected with encapsulant 152. Wire bonding and encapsulating the wire bonds can be performed prior to electrically connecting the SiP 100 to the circuit board 200, and can be prior to singulating the SiP 100. In the particular embodiment illustrated, interposers 146 are provided between bumps 142 electrically connecting the SiP 100 to the circuit board 200 to create a structural height to accept the wire bonds. In another embodiment, cored bumps can be used to provide the structural height.

Figure 13:
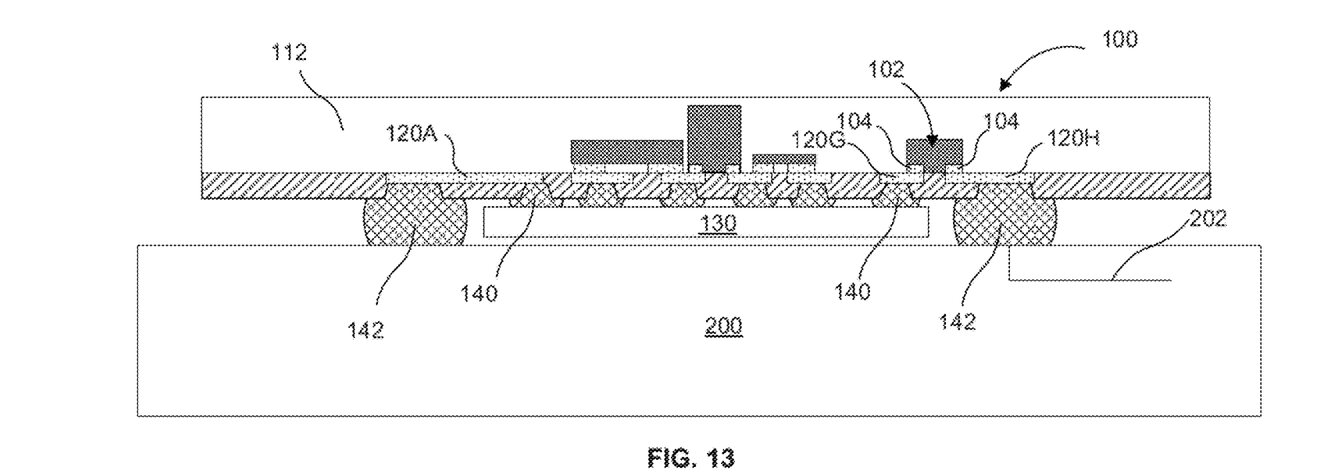
FIG. 13 is a cross-sectional side view illustration of a device component electrically connected to both the active device die and the circuit board in accordance with an embodiment of the invention.

Referring now to FIG. 13, in an embodiment, one of the device components 102 is electrically connected to a first trace 120G in the single RDL that is also electrically connected to the active device die 130. The same device component 102 is also electrically connected to a second trace 120H in the single RDL that is also electrically connected to the circuit board 200. The specific device component 102 pointed to in FIG. 13 may be a passive device component or an active device component.

In one embodiment, the device component 102 is a passive device component such as a capacitor and is electrically connected to a line 202 in the circuit board such as a ground line, power line, or signal line. In such an embodiment, a direct current (DC) coming from a signal port in the active device die 130 may be blocked or rerouted by the passive device 102 so that the DC current does not travel along the signal line 202 in the circuit board 200 connected to an antenna (which is designed to receive only a radio frequency (RF) signal). In another embodiment, the passive device component 102 may function as a frequency selector for a signal line 202 in the circuit board 200 going to an antenna due to the impedance of the signal coming from a signal port in the active device die 130.

In one embodiment, the device component 102 is an active device component such as a power amplifier or RF switch, either of which can be based on a gallium arsenide die. In such an embodiment, the active device component 102 may amplify or select a RF signal coming from a signal port in the active device die 130 and transmit the amplified or selected RF signal along a signal line 202 in the circuit board 200 which is connected to an antenna. In an alternative embodiment, the active device die 130 is a SOC die which includes a power amplifier. In such an embodiment, the SOC die may transmit an amplified signal through trace 120A to a signal line 202 in the circuit board 200 which is connected to an antenna.

Figure 14:
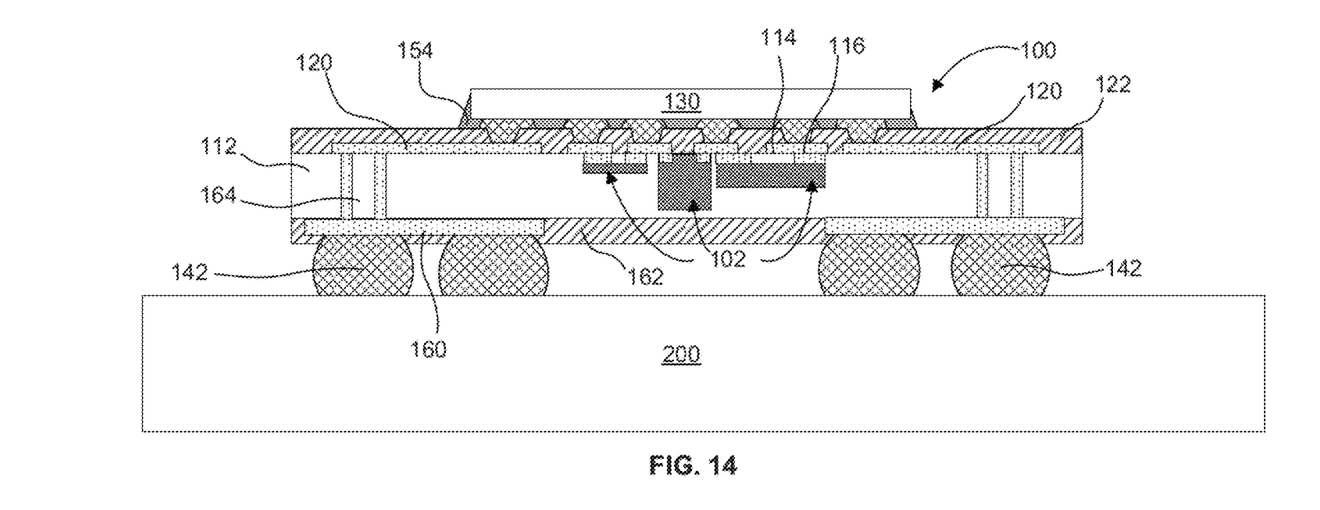
FIG. 14 is a cross-sectional side view illustration of a package electrically connected to a circuit board in accordance with an embodiment of the invention.

Referring now to FIG. 14, in an embodiment, a SiP 100 is electrically connected to a circuit board 200 with the active device 130 over the single RDL 120 and the circuit board 200. Such an embodiment may be useful if the active device die 130 has more connections than just to the device components 102. In such a case, the (x, y) form factor dimension can be reduced with a slightly larger z dimension form factor than in other embodiments. As previously described, the SiP 100 includes a plurality of device components 102 with different form factors embedded within a molding compound layer 112, where a surface for each of the device components 102 is coplanar with a surface of the molding compound layer 112. A single RDL 120 is formed on the coplanar surfaces of the molding compound layer and the plurality of device components. An active device die 130 is electrically bonded to the single RDL 120 directly vertically adjacent the plurality of device components 102. A plurality of conductive interconnects 164 are arranged along a periphery of the single RDL 120 electrically connecting the SiP 100 to the circuit board 120. In the particular embodiment illustrated, the conductive interconnects 164 are vias extending through the molding compound layer 112 from the single RDL 120 to a backside single RDL 160 and buildup layer 162. Conductive bumps 142 may additionally be used to electrically connect the vias 164 to the circuit board 200.

Figure 15:
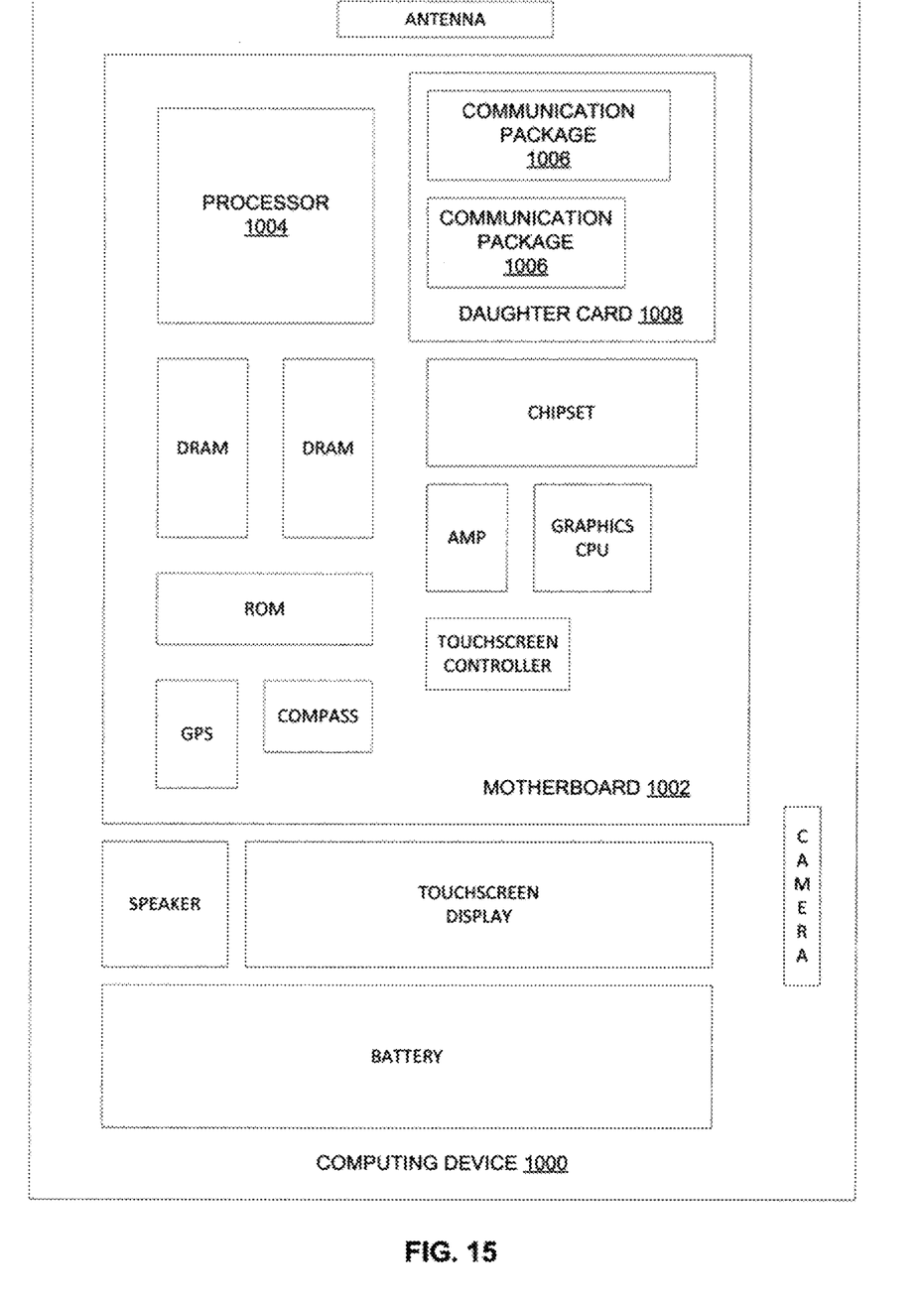
FIG. 15 is a block diagram illustration of a computing device in accordance with an embodiment of the invention.

FIG. 15 illustrates a computing device 1000 in accordance with one implementation of the invention. The computing device 1000 houses a board 1002, which may be a circuit board such as a motherboard. The board 1002 may include a number of components, including but not limited to a processor 1004 and at least one communication package 1006 that may be any of the SiP packages formed in accordance with implementations of the invention. The processor 1004 is physically and electrically coupled to the board 1002. In some implementations at least one communication package 1006 is also physically and electrically coupled to the board 1002. In further implementations, the communication package 1006 is physically and electrically coupled to another circuit board such as a card 1008 (e.g. a daughter card), which is physically and electrically coupled to the board 1002. In further implementations, the communication package 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication package 1006 may be any of the SiP packages that are formed in accordance with implementations of the invention. The communication package 1006 enables wireless communications for the transfer of data to and from the computing device 1000. The term "wireless"

and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication packages 1006. For instance, a first communication package 1006 may be dedicated to shorter range wireless communications such as Wi-Fi and Bluetooth and a second communication package 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors or metal interconnects. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In an embodiment, a system in package comprises a plurality of device components with different form factors embedded within a molding compound layer, wherein a surface for each of the device components is coplanar with a surface of the molding compound layer; a single redistribution layer is formed on the coplanar surfaces of the molding compound layer and the plurality of device components; and an active device die is electrically bonded to the single redistribution layer directly vertically adjacent the plurality of device components. The plurality of device components may have a plurality of different heights, widths, and lengths. The active device die may be electrically bonded to the single redistribution layer with bonds selected from the group consisting of solder bumps and wire bonds. A plurality of conductive interconnects may further be arranged along a periphery of the single redistribution layer. A plurality of conductive interconnects may be arranged along a periphery of the single redistribution layer. In an embodiment, one of the device components is electrically connected to a first trace in the single redistribution layer that is electrically connected to the active device die, and electrically connected to a second trace in the single redistribution layer that is electrically connected to one of the conductive interconnects.

In an embodiment, the plurality of device components are passive device components. For example the active device die may include a radio transceiver integrated circuit, and the passive device components include a component selected from the group consisting of a band pass filter, capacitor, inductor, resistor, and crystal for clock generation. In an embodiment, the plurality of device components include passive device components and an active device component. For example, the active device die may include a radio transceiver integrated circuit, the active device component may include a component selected from the group consisting of a power amplifier and RF switch, and the passive device components include a component selected from the group consisting of a band pass filter, capacitor, inductor, resistor, and crystal for clock generation.

In an embodiment a system comprises a circuit board and a system in package. The system in package comprises a plurality of device components with different form factors embedded within a molding compound layer, wherein a surface for each of the device components is coplanar with a surface of the molding compound layer; a single redistribution layer formed on the coplanar surfaces of the molding compound layer and the plurality of device components; and an active device die electrically bonded to the single redistribution layer directly vertically adjacent the plurality of device components. A plurality of conductive interconnects are arranged along a periphery of the single redistribution layer electrically connecting the system in package to the circuit board. The active device die may not be in direct contact with the circuit board. The conductive interconnects can be conductive bumps including an inner core material and outer shell material, with the inner core material having a higher melting temperature than the outer shell material. The conductive interconnects can comprise conductive bumps electrically connected to interposers. In an embodiment one of the device components is electrically connected to a first trace in the single redistribution layer that is electrically connected to the active device die, and electrically connected to a second trace in the single redistribution layer that is electrically connected to the circuit board. For example, the device component can be a passive device component selected from the group consisting of a capacitor and inductor and is electrically connected to a line in the circuit board selected from the group consisting of a ground line, power line, and signal line.

The system in package can be electrically connected to the circuit board with the active device die between the single redistribution layer and the circuit board, or with the active device die over the single redistribution layer and the circuit board. In an embodiment, conductive interconnects comprise vias through the molding compound layer electrically connecting the single redistribution layer to the circuit board. In an embodiment, the circuit board is a daughter card or a motherboard. In an embodiment, the circuit board is secured within a computing device such as a tablet or smart phone comprising an antenna, a battery, and a microprocessor electrically connected with the circuit board.

In an embodiment, a method of assembling a system in package comprises placing a plurality of device components having different form factors on a carrier substrate; forming a molding compound layer over the device components, wherein a bottom surface of the device components is coplanar with a bottom surface of the molding compound layer and the plurality of device components are embedded within the molding compound layer; curing the molding compound layer; removing the carrier substrate; forming a single redistribution layer on the coplanar bottom surfaces of the molding compound layer and the plurality of device components; forming a buildup layer on the single redistribution layer; forming a plurality of openings in the buildup layer; electrically bonding an active device die to the single redistribution layer of the package and directly vertically adjacent the plurality of device components; and singulating the system in package. In an embodiment, the method further includes placing a plurality of conductive bumps along a periphery of the single redistribution layer prior to singulating the system in package. In an embodiment, the method further includes providing an underfill material between the active device die and the buildup layer. In an embodiment, the method further includes electrically connecting the system in package to a circuit board with the active device die between the single redistribution layer and the circuit board. In an embodiment, the method further includes electrically connecting the system in package to a circuit board with the active device die over both the single redistribution layer and the circuit board.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the SiPs and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A system in package, comprising:
a plurality of device components with different form factors embedded within a molding compound layer, wherein a surface for each of the device components is coplanar with a surface of the molding compound layer, and wherein the plurality of device components has a footprint;
a redistribution layer formed on the coplanar surfaces of the molding compound layer and the plurality of device components;
an active device die electrically coupled to the redistribution layer and directly vertically adjacent the plurality of device components, wherein the active device die has a footprint, and wherein the footprint of the plurality of device components is entirely within the footprint of the active device die; and
a plurality of conductive vias in the molding compound and horizontally adjacent to the plurality of device components, the plurality of conductive vias coupled to the redistribution layer, wherein the footprint of the plurality of device components is within the plurality of conductive vias, and wherein the footprint of the active device die is within the plurality of conductive vias.

2. The system in package of claim 1, wherein the active device die is directly bonded to the redistribution layer.

3. The system in package of claim 1, wherein the plurality of device components have a plurality of different heights, lengths and widths.

4. The system in package of claim 1, wherein the plurality of device components are passive device components.

5. The system in package of claim 4, wherein the active device die includes a radio transceiver integrated circuit, and the passive device components include a component selected from the group consisting of a band pass filter, capacitor, inductor, resistor, and crystal for clock generation.

6. The system in package of claim 1, wherein the plurality of device components include passive device components and an active device component.

7. The system in package of claim 6, wherein:
the active device die includes a radio transceiver integrated circuit;
the active device component is selected from the group consisting of a power amplifier and an RF switch; and
the passive device components include a component selected from the group consisting of a band pass filter, capacitor, inductor, resistor, and crystal for clock generation.

8. The system in package of claim 1, wherein the active device die is electrically bonded to the redistribution layer with bonds selected from the group consisting of solder bumps and wire bonds.

9. The system in package of claim 1, wherein one of the device components is electrically connected to a first trace in the redistribution layer that is electrically connected to the active device die.

10. The system in package of claim 1, wherein the molding compound comprises a material selected from the group consisting an epoxy resin, a phenolic resin, a polyimide, and a poly-benzoxasole.

11. A system, comprising:
a circuit board;
a system in package, comprising:
a plurality of device components with different form factors embedded within a molding compound layer, wherein a surface for each of the device components is coplanar with a first surface of the molding compound layer, and wherein the plurality of device components has a footprint;
a redistribution layer formed on the coplanar surfaces of the molding compound layer and the plurality of device components;
an active device die electrically coupled to the redistribution layer and directly vertically adjacent the plurality of device components, wherein the active device die has a footprint, and wherein the footprint of the plurality of device components is entirely within the footprint of the active device die; and
a plurality of conductive vias in the molding compound and horizontally adjacent to the plurality of device components, the plurality of conductive vias coupled to the redistribution layer, wherein the footprint of the plurality of device components is within the plurality of conductive vias, and wherein the footprint of the active device die is within the plurality of conductive vias; and
a plurality of conductive bumps electrically connecting the plurality of conductive vias to the circuit board, the plurality of conductive bumps at a second surface of the molding compound opposite the first surface of the molding compound.

12. The system of claim 11, wherein the active device die is directly bonded to the redistribution layer.

13. The system of claim 11, wherein the plurality of device components have a plurality of different heights, lengths and widths.

14. The system of claim 11, wherein the plurality of device components are passive device components.

15. The system of claim 14, wherein the active device die includes a radio transceiver integrated circuit, and the passive device components include a component selected from the group consisting of a band pass filter, capacitor, inductor, resistor, and crystal for clock generation.

16. The system of claim 11, wherein the plurality of device components include passive device components and an active device component.

17. The system of claim 16, wherein:
the active device die includes a radio transceiver integrated circuit;
the active device component is selected from the group consisting of a power amplifier and an RF switch; and
the passive device components include a component selected from the group consisting of a band pass filter, capacitor, inductor, resistor, and crystal for clock generation.

18. The system of claim 11, wherein the active device die is electrically bonded to the redistribution layer with bonds selected from the group consisting of solder bumps and wire bonds.

19. The system of claim 11, wherein one of the device components is electrically connected to a first trace in the single redistribution layer that is electrically connected to the active device die.

20. The system of claim 11, wherein the molding compound comprises a material selected from the group consisting an epoxy resin, a phenolic resin, a polyimide, and a poly-benzoxasole.

* * * * *